(12) United States Patent
Weber

(10) Patent No.: US 6,515,543 B2
(45) Date of Patent: Feb. 4, 2003

(54) CIRCUIT CONFIGURATION FOR CONTROLLING NONLINEAR PATHS

(75) Inventor: Stephan Weber, München (DE)

(73) Assignee: Infineon Technologies AG, Munich (DE)

( * ) Notice: Subject to any disclaimer, the term of this patent is extended or adjusted under 35 U.S.C. 154(b) by 84 days.

(21) Appl. No.: 09/809,787

(22) Filed: Mar. 16, 2001

(65) Prior Publication Data

US 2001/0026190 A1 Oct. 4, 2001

(30) Foreign Application Priority Data

Mar. 16, 2000 (DE) .......................... 100 12 863

(51) Int. Cl.$^7$ ............................... H03F 1/30
(52) U.S. Cl. ....................... 330/149; 330/110; 375/297; 455/63; 455/126
(58) Field of Search ................ 330/110, 149; 375/297; 455/63, 126

(56) References Cited

U.S. PATENT DOCUMENTS

| | | | | |
|---|---|---|---|---|
| 5,442,510 A | * | 8/1995 | Schwartz et al. .............. | 700/32 |
| 5,760,646 A | * | 6/1998 | Belcher et al. .............. | 330/149 |
| 5,873,029 A | * | 2/1999 | Grondahl et al. ............ | 327/513 |
| 5,963,090 A | * | 10/1999 | Fukuchi ....................... | 330/136 |
| 6,104,241 A | * | 8/2000 | Cova et al. .................. | 330/149 |

FOREIGN PATENT DOCUMENTS

DE    196 45 562 A1    10/1997

OTHER PUBLICATIONS

"Regler mit Parallelstruktur" [control unit with parallel structure], Elektronik, 1993, No. 6, vol. 22, p. 229.
G. Schmidt: "Grundlagen der Regelungstechnik" [fundamentals of control engineering], Springer Verlag, Berlin, 1982, pp. 92–96.
Hans Schuler (ed.): "Prozeßführung" [process maangement], R. Oldenbourg Verlag, München, 1999, pp. 150–152, 184–185.

Tietze/Schenk: "Halbleiter–Schaltungstechnik", 10$^{th}$ ed., 1993, pp. 151–152.

* cited by examiner

Primary Examiner—Michael Tokar
Assistant Examiner—Khai M. Nguyen
(74) Attorney, Agent, or Firm—Laurence A. Greenberg; Werner H. Stemer; Ralph E. Locher

(57) ABSTRACT

An electrical circuit is provided for controlling nonlinear paths. A first linearization block and a second linearization block are provided, which may each have a characteristic curve that is the inverse of that of the control path. The first linearization block is configured in a feedback path running from the output of the control path to an input of a regulator. The second linearization block is configured for supplying a reference variable to an input of the regulator. Nonlinearities in the control path are thus linearized. In consequence, major changes in the reference variable are acceptable. The linearization blocks can be designed in a simple manner and require only a small surface area, since low power levels are normally produced at the inputs of an operational amplifier contained in the regulator. An additional advantage resulting from this is compensation for temperature drift of the two linearization blocks. The described regulator is suitable, for example, for controlling a transmission amplifier, as is used in mobile radio applications.

9 Claims, 2 Drawing Sheets

CIRCUIT CONFIGURATION FOR CONTROLLING NONLINEAR PATHS

BACKGROUND OF THE INVENTION

Field of the Invention

The present invention relates to an electronic circuit for controlling nonlinear paths.

The object of a regulator is to bring a physical variable, the controlled variable X, to a predetermined nominal value, the reference variable W, and to keep it there. To this end, the regulator needs to counteract the influence of disturbances, in some suitable way.

Normally, a simple control loop has a regulator which influences the controlled variable X by means of a manipulated variable Y, such that the control error W−X is as small as possible.

If the controlled variable is represented by an electrical voltage and the path is electrically controlled, electronic regulators can be used.

In its simplest form, such a regulator is an amplifier which amplifies the control error W−X. If the controlled variable X rises above the nominal value W, then W−X becomes negative. The manipulated variable Y is thus reduced to an increased extent. This reduction counteracts the assumed increase in the controlled variable, thus producing negative feedback. As the gain of the regulator becomes higher, the remaining control error in the steady state becomes lower.

In order to improve the adjustment accuracy of a proportional (P) regulator and in order to achieve a remaining control error of zero, an integrator is connected in parallel with a P regulator. A simple PI (proportional plus integral) regulator such as this behaves like an integrator at low frequencies, and like a pure proportional amplifier at high frequencies.

In practice, control paths often have a nonlinear response. For example, transistor amplifiers or diode rectifiers have nonlinear characteristic curves. The transfer function characteristics often have saturation effects at the control limits. The transfer function characteristics are also influenced by the operating voltage, input level and temperature.

For small disturbances about a given operating point, any path can be regarded as being linear, provided its characteristic curve in the vicinity of this operating point is continuous and can be differentiated. The regulator can now be optimized for this fixed operating point. However, if major changes in the reference variable W will be permissible, problems occur. Since the differential path gain is dependent on the operating point, the steady-state response of the configuration varies as a function of the reference variable W. The stability and control accuracy of the regulator also become poorer. The accuracy of a regulator is influenced by the accuracy of the controlled variable detector, the gain and the regulator offset.

This problem can be overcome in a known manner by linearizing the path by a function network connected upstream. If this linearization block has the inverse characteristic curve to that of the path to be linearized, then this results in a linear path equation overall. If, for example, the path has an exponential response, a logarithm former is required as the function network or linearization block. Such linearization is known, for example, from Tietze, Schenk: Halbleiter-Schaltungstechnik [Semiconductor circuit technology], 10th Edition, 1993, pages 951 to 952.

The additional linearization block is normally subject to drift with temperature or age. Furthermore, the control system overall becomes slower, since the additional linearization block has delay-time effects, of course. Since the known linearization block is configured at the output of the regulator and upstream of the control path, considerable currents flow there. Furthermore, a considerable voltage change can be expected at the output of a control amplifier which, for example, may be an operational amplifier in a simple embodiment. The design of a circuit configuration for an implementation block is thus subject to stringent requirements. In particular, a considerable chip surface area is required.

SUMMARY OF THE INVENTION

It is accordingly an object of the invention to provide a circuit configuration for controlling nonlinear paths which overcomes the above-mentioned disadvantageous of the prior art apparatus and methods of this general type, and which can be produced at low cost.

With the foregoing and other objects in view there is provided, in accordance with the invention, a circuit configuration for controlling nonlinear paths that includes a regulator having an output for providing a manipulated variable and having a plurality of inputs which include a first input and a second input. A nonlinear control path has an input connected to the output of the regulator and has an output for providing a controlled variable. A feedback path has a first linearization block disposed therein. The first linearization block has an input connected to the output of the control path and has an output connected to one of the plurality of the inputs of the regulator. A second linearization block has an output connected to one of the plurality of the inputs of the regulator. The second linearization block has an input for receiving a reference variable.

The circuit configuration for controlling nonlinear paths is based on the principle of arranging linearization blocks at the regulator input rather than at the regulator output. Since considerably lower currents can be expected at a regulator input than at the output, and the voltage change that occurs is considerably smaller, the linearization blocks, can be designed to be simpler. Furthermore, if the electrical power levels which can be expected are relatively low, considerably smaller chip surface areas are required. In addition, the signal processing for relatively low power levels is simpler.

Linearization blocks which are nonlinear blocks are normally subject to temperature drift and tolerances which can be governed, for example, by manufacturing or environmental conditions. Since two linearization blocks are connected to the regulator input or inputs in the described configuration, with one linearization block being configured in a feedback path and a second linearization block being configured at the nominal-value or reference-value supply, their temperature drift and tolerances cancel one another out.

In accordance with an added feature of the invention, the first and second linearization blocks are identical.

In accordance with an additional feature of the invention, the first and the second linearization blocks each have a function which is the inverse of that of the control path. The characteristic curves of the first linearization block and of the second linearization block are, in consequence, each an inverse of the characteristic curve of the path. The characteristic curve of the path may in this case be composed of the characteristic curves of a number of blocks in the path, for example amplifier stages.

In accordance with another feature of the invention, the regulator is a PI regulator. Regulators with an I element have a very high steady-state accuracy.

In accordance with a further feature of the invention, the regulator is in the form of a simple operational amplifier. Thus, if a regulator is intended to have an I element, a capacitor is connected between the output of the operational amplifier and the inverting input of the operational amplifier.

In accordance with a further added feature of the invention, if the described control system is used in a transmission amplifier for the field of mobile radio devices, the control path may have two series-connected transistor amplifier stages. Transistor amplifiers normally have nonlinear characteristic curves.

In accordance with a further additional feature of the invention, in order to detect the controlled variable, a detector can be configured in the feedback path between the output of the path and the first linearization block.

In accordance with yet an added feature of the invention, in order to compensate for temperature drift or tolerances in this detector, a further detector having the same electrical properties can be connected upstream of the second linearization block. In this case, the reference variable can be supplied to the further detector.

In accordance with yet an additional feature of the invention, in order to produce a differential amplifier, the first linearization block, which is configured in the feedback of the control loop, can be connected to a first input of the regulator, and a second linearization block can be connected to a second input of the regulator. If an operational amplifier is used as the control amplifier, the first linearization block can be connected to the inverting input of the operational amplifier, and the second linearization block can be connected to the noninverting input of the operational amplifier. Without negative feedback, a control system is not stable.

In accordance with a concomitant feature of the invention, the operational amplifier may be connected as an adder. In this case, the first and second linearization blocks are jointly connected to one input of the control amplifier. In this configuration, a resistor can in each case be configured between the output of the linearization block and the input of the operational amplifier.

Further embodiments of the present invention are specified in the dependent claims.

Other features which are considered as characteristic for the invention are set forth in the appended claims.

Although the invention is illustrated and described herein as embodied in a circuit configuration for controlling nonlinear paths, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
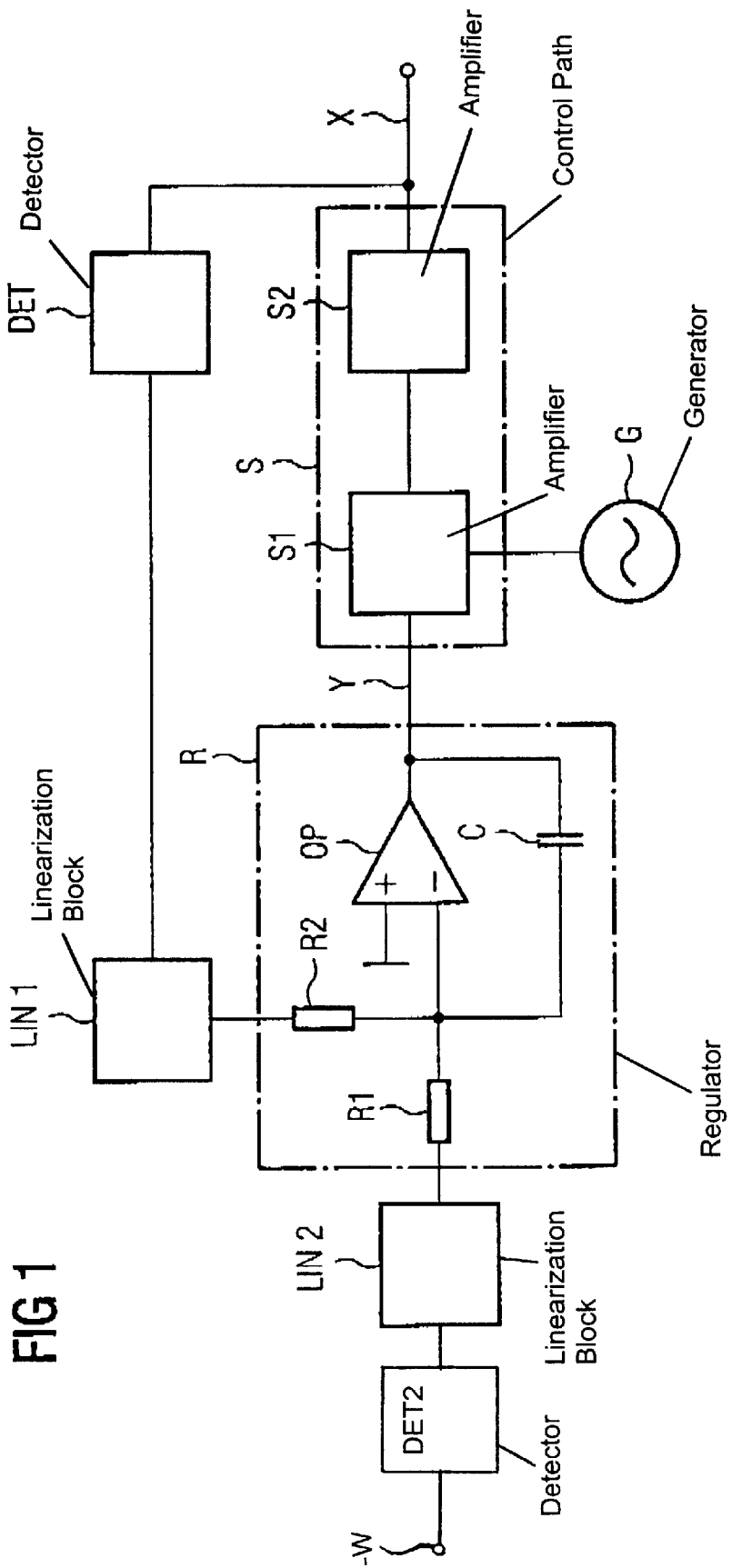
FIG. 1 shows a block diagram of a first exemplary embodiment of the present invention.

Referring now to the figures of the drawing in detail and first, particularly, to FIG. 1 thereof, there is shown a control loop with a regulator R, a control path S and feedback. A reference variable W can be supplied to the regulator. A controlled variable X can be tapped off at the output of the path. The input of the path S is connected to the output of the regulator R. The reference variable Y is applied at this point. The controlled variable X can be supplied to the regulator R in a feedback path.

The path S has a nonlinear characteristic curve. It is sufficient for this purpose for an element or block S1, S2 of the path S to have a nonlinear characteristic curve. Two linearization blocks LIN1, LIN2 are provided in order to linearize the control path S. A first linearization block LIN1 is configured in the feedback between the output of the path S and one input of the regulator R. A second linearization block LIN2 is likewise connected to one input of the regulator R. The reference variable can be supplied to this second linearization block LIN2. In order to detect the controlled variable X, a detector DET is configured between the output of the path S and the input of the first linearization block LIN1. The regulator R has an operational amplifier OP which, in order to form an integrating element of the regulator, has a capacitor C which is configured between the output and the inverting input of the operational amplifier OP. In order to form a PI regulator, a resistor (which is not shown) can be connected in series with the capacitor C. The first linearization block LIN1 is likewise connected via a resistor R2 to the inverting input of the operational amplifier OP. The noninverting input of the operational amplifier OP is connected to ground. The second linearization block LIN2 is likewise connected via a further resistor R1 to the inverting input of the operational amplifier OP, forming an adder node with the feedback. In order that the difference between the reference variable W and the controlled variable X can be supplied to the regulator, the inverted reference variable −W needs to be applied to the input of the second linearization block LIN2. In the present example, the path S has a first block S1 and a downstream, second block S2. These may, for example, each represent a transistor amplifier stage. A generator G, which, by way of example, is connected only to the first block S1 of the path S, supplies electrical power to the transistor amplifier stage S1.

The use of a configuration of two linearization blocks LIN1 and LIN2, which, for example, may have identical electrical properties, compensates for their mutual temperature drift. In the same way, aging-dependent drift is compensated for, as are manufacturing tolerances. The nonlinear path S, whose nonlinearity is due to the fact that at least one block S1, S2 in the path S has a nonlinear characteristic curve, is linearized in the circuit according to the invention by the configuration of a first and a second linearization block LIN1, LIN2. This makes it possible to control the nonlinear control path using a conventional linear regulator. The linearization blocks LIN1, LIN2 are configured on the input side of the operational amplifier OP, where the currents which flow are normally low and where only small voltage changes are expected, so that the power levels which are produced are thus low. Therefore, because the linearization blocks LIN1, LIN2 are configured at the input side of the operational amplifier OP, they can be designed in a simple manner, with better dynamic properties and only require a small area on the chip surface. The low power levels which are normally produced there allow simple signal processing. If the detector DET also has a temperature drift that is not negligible, a further detector DET2 can be connected upstream of the second linearization block LIN2 in order to compensate for this temperature drift, or other drifts.

Figure 2:
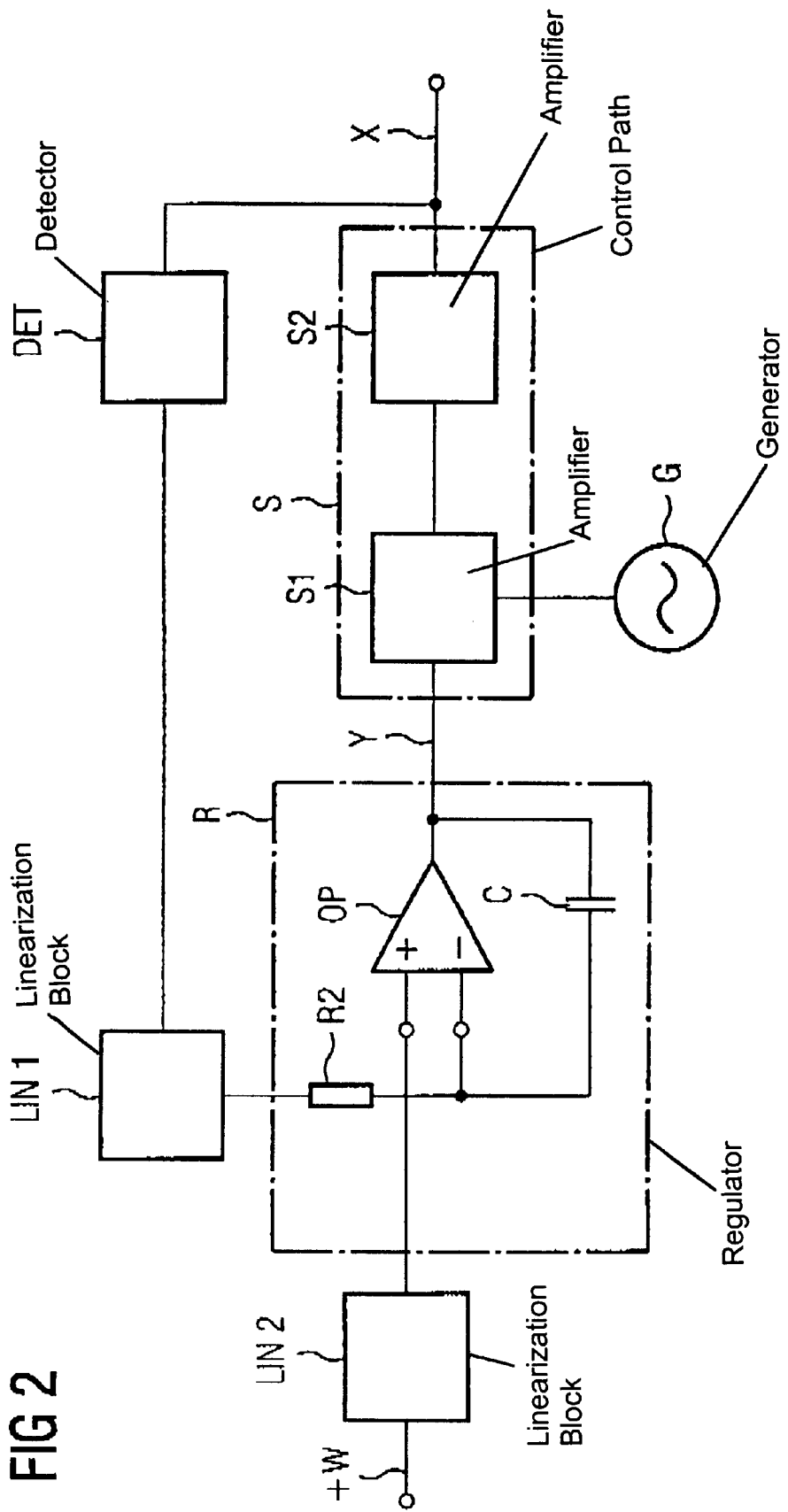
FIG. 2 shows a block diagram of a second exemplary embodiment of the present invention.

FIG. 2 shows a second exemplary embodiment of the present invention. In this case as well, a first linearization block LIN1 and a second linearization block LIN2 are respectively configured at a nominal input and an actual input of the regulator R. In contrast to the regulator shown in FIG. 1, in which the control amplifier is connected as an adder, the regulator R in FIG. 2 is connected as a differential amplifier. For this purpose, the controlled variable X is detected by a detector DET, is passed to the input of a first linearization block LIN1, and is supplied via a resistor R2 to the inverting input of the operational amplifier OP. The noninverting input of the operational amplifier OP is connected to the output of a second linearization block LIN2. The input of the second linearization block LIN2, whose output is connected to the noninverting input of the operational amplifier OP, can be supplied with the reference variable W.

In this case, the reference variable W does not need to be supplied inverted, since the difference between the reference variable W and the controlled variable X is ensured by connecting the operational amplifier OP as a differential amplifier. The rest of the circuit configuration shown in FIG. 2 is designed as shown in FIG. 1. The advantages of the described circuit configuration are thus retained.

Regulators other than the I or the PI regulator illustrated can also be used as the regulator R. The principle of the configuration of two linearization blocks LIN1, LIN2 for supplying the controlled variable X and the reference variable W, respectively, to the regulator R is retained in this case.

I claim:

1. A circuit configuration for controlling nonlinear paths, comprising:
   a regulator having an output providing a manipulated variable and having a plurality of inputs which include a first input and a second input;
   a nonlinear control path having an input connected to said output of said regulator and having an output providing a controlled variable;
   a feedback path having a first linearization block disposed therein, said first linearization block having an input connected to said output of said control path and having an output connected to one of said plurality of said inputs of said regulator; and
   a second linearization block having an output connected to one of said plurality of said inputs of said regulator, said second linearization block having an input for receiving a reference variable.

2. The circuit configuration according to claim 1, wherein said first linearization block and said second linearization block are identical.

3. The circuit configuration according to claim 2, wherein said control path is defined by a characteristic curve, and said first linearization block and said second linearization block are each defined by a characteristic curve that is an inverse of said characteristic curve of said control path.

4. The circuit configuration according to claim 1, wherein said regulator is a PI regulator.

5. The circuit configuration according to claim 1, comprising:
   a capacitor;
   said regulator constructed as an operational amplifier having an inverting input defining said first input and a noninverting input defining said second input, said operational amplifier having an output defining said output of said regulator;
   said capacitor connected between said output of said operational amplifier and said inverting input of said operational amplifier.

6. The circuit configuration according to claim 1, comprising two series-connected transistor amplifier stages disposed in said control path.

7. The circuit configuration according to claim 1, comprising a detector for detecting the controlled variable, said detector connected between said output of said control path and said input of said first linearization block.

8. The circuit configuration according to claim 7, comprising a further detector connected to said input of said second linearization block, said further detector for receiving the reference variable.

9. The circuit configuration according to claim 1, wherein said first linearization block is connected to said first input of said regulator, and said second linearization block is connected to said second input of said regulator.

* * * * *